(12) United States Patent
Pastrana et al.

(10) Patent No.: US 9,941,800 B2
(45) Date of Patent: Apr. 10, 2018

(54) MEASURING INPUT VOLTAGES FROM REFERENCE WINDINGS OF POWER CONVERTERS WITH LIMITED ON-TIME

(71) Applicant: Apple Inc., Cupertino, CA (US)

(72) Inventors: Juan Carlos Pastrana, San Jose, CA (US); Manisha P. Pandya, Sunnyvale, CA (US); Sameer G. Kelkar, Santa Clara, CA (US); Nicholas A. Sims, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 178 days.

(21) Appl. No.: 14/843,777

(22) Filed: Sep. 2, 2015

(65) Prior Publication Data

US 2016/0065080 A1    Mar. 3, 2016

Related U.S. Application Data

(60) Provisional application No. 62/044,474, filed on Sep. 2, 2014.

(51) Int. Cl.
*H02M 3/335* (2006.01)
*G01R 19/00* (2006.01)
*H02M 1/00* (2006.01)

(52) U.S. Cl.
CPC .... *H02M 3/33507* (2013.01); *G01R 19/0084* (2013.01); *H02M 2001/0022* (2013.01)

(58) Field of Classification Search
CPC .................. H02M 3/33507; H02M 3/33523
USPC ........................................... 363/21.12, 21.16
See application file for complete search history.

(56) References Cited

U.S. PATENT DOCUMENTS

| | | | |
|---|---|---|---|
| 9,318,965 B2 * | 4/2016 | Schroeder gen Berghegger | H02M 3/33546 |
| 2002/0101746 A1 * | 8/2002 | Loef | H02M 1/4258 363/71 |
| 2015/0236597 A1 * | 8/2015 | Hinz | H02M 1/08 363/21.17 |

* cited by examiner

*Primary Examiner* — Adolf Berhane
*Assistant Examiner* — Afework Demisse
(74) *Attorney, Agent, or Firm* — Blank Rome LLP (57) ABSTRACT

The disclosed embodiments provide a system that operates switched-mode power supplies, such as flyback converters. The power supplies may comprise isolated or non-isolated power converters. During operation, the system senses an on-time of a primary switch in the power converter. Upon detecting that the on-time does not exceed an on-time threshold within a first pre-specified period that spans one or more switching cycles, the system extends the on-time during a subsequent switching cycle to at least meet the on-time threshold. The system may then measure the voltage on one or more reference windings of the power converter during the on-time of the subsequent switching cycle, wherein the reference winding may comprise, e.g., an auxiliary winding of the primary winding of the power converter or a secondary winding of the power converter (e.g., in the case of isolated power converters utilizing a transformer).

20 Claims, 7 Drawing Sheets

MEASURING INPUT VOLTAGES FROM REFERENCE WINDINGS OF POWER CONVERTERS WITH LIMITED ON-TIME

BACKGROUND

Field

The disclosed embodiments relate to power converters for electronic devices. Specifically, the disclosed embodiments relate to switched-mode power supplies (SMPS), e.g., flyback converters, which incorporate a switching regulator to efficiently convert electrical power from a source to a load. More specifically, the disclosed embodiments relate to techniques for measuring supply voltages from one or more "reference windings" of power converters with limited on-times. Reference windings, as used herein, may comprise, e.g., an auxiliary winding that reflects to the primary winding of a power supply or a secondary winding of a transformer (i.e., in the case of an isolated power supply).

Related Art

Switched-mode power supplies (SMPS) may be used to convert alternating current (AC) to direct current (DC) in low-power applications such as mobile phone chargers and/or laptop computer power supplies. More particularly, SMPSs transfer power from a source, such as mains power, to a "load," e.g., the aforementioned mobile phones and/or laptop computers, while converting voltage and current characteristics of the power source. SMPSs may be broken down into two major categories: isolated and non-isolated. Non-isolated SMPSs include, e.g., buck converters, boost converters, buck-boost converters, and the like. Isolated SMPSs include, e.g., flyback converters, half bridges, full bridges, and the like. For the purpose of discussion herein, flyback converters will be used as the exemplary SMPS topology, although the techniques disclosed herein may be readily adaptable to other power supply topologies that employ a switching regulator and one or more reference windings for measuring voltage during cycle on-times.

During operation of a flyback converter, the input voltage of the flyback converter may be sensed by measuring the voltage of one or more reference windings in the flyback converter during the on-time of a primary switch in the flyback converter. For example, the input voltage may be sensed through the voltage on the auxiliary winding during the on-time of the primary switch because the voltage on the auxiliary winding is proportional to the input voltage. Likewise, the output voltage may be sensed through the voltage on the secondary winding during the on-time of the primary switch because the voltage on the secondary winding is proportional to the input voltage. The sensed input voltage may then be used to control the switching frequency, duty cycle, and/or other operating parameters of the flyback converter.

However, the voltage on a reference winding may initially experience distortion, e.g., "ringing," after the primary switch is toggled from an off-state to an on-state. After the voltage has settled, the measurement of the voltage may be made over a subsequent time period. As a result, accurate measurement of the voltage on the reference winding may require that the primary switch in the flyback converter has a minimum on-time that includes both the time for the voltage to settle and the time required to perform the measurement.

Consequently, operation of flyback converters may be facilitated by mechanisms for accurately sensing input (or output, in the case of using a secondary winding as the reference winding) voltages of the flyback converters through voltages on reference windings of the flyback converters.

SUMMARY

The disclosed embodiments provide a system that operates a switched-mode power supply (SMPS), such as a flyback converter. During operation, the system senses an on-time of a primary switch in the flyback converter. Upon detecting that the on-time does not exceed an on-time threshold within a first pre-specified period that spans one or more switching cycles, the system extends the on-time during a subsequent switching cycle to at least meet the on-time threshold. The system then measures the voltage on one or more references winding (e.g., or one or more auxiliary windings) during the on-time of the subsequent switching cycle.

In some embodiments, the system also uses the measured voltage to control the operation of the power converter.

In some embodiments, controlling the operation of the power converter includes at least one of controlling a switching frequency of the power converter, and controlling a duty cycle of the primary switch.

In some embodiments, the system also obtains one or more additional measurements of the voltage on the reference winding during one or more subsequent extended on-times of the primary switch. Upon detecting that a pre-specified number of consecutive measurements containing the measured voltage and the one or more additional measurements exceeds the voltage threshold, the system disables measurement of the voltage on the reference winding for a second pre-specified period.

In some embodiments, the first pre-specified period is at least one of a time interval and a number of switching cycles of the primary switch.

In some embodiments, the on-time threshold is based on a first period associated with settling of the voltage on the reference winding, and a second period associated with measuring the voltage on the reference winding.

In some embodiments, the primary switch includes a metal-oxide-semiconductor field-effect transistor (MOSFET), bipolar junction transistor (BJT), junction gate field-effect transistor (JFET), insulated gate field-effect transistor (IGFET), insulated-gate bipolar transistor (IGBT), or other suitable transistor type.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
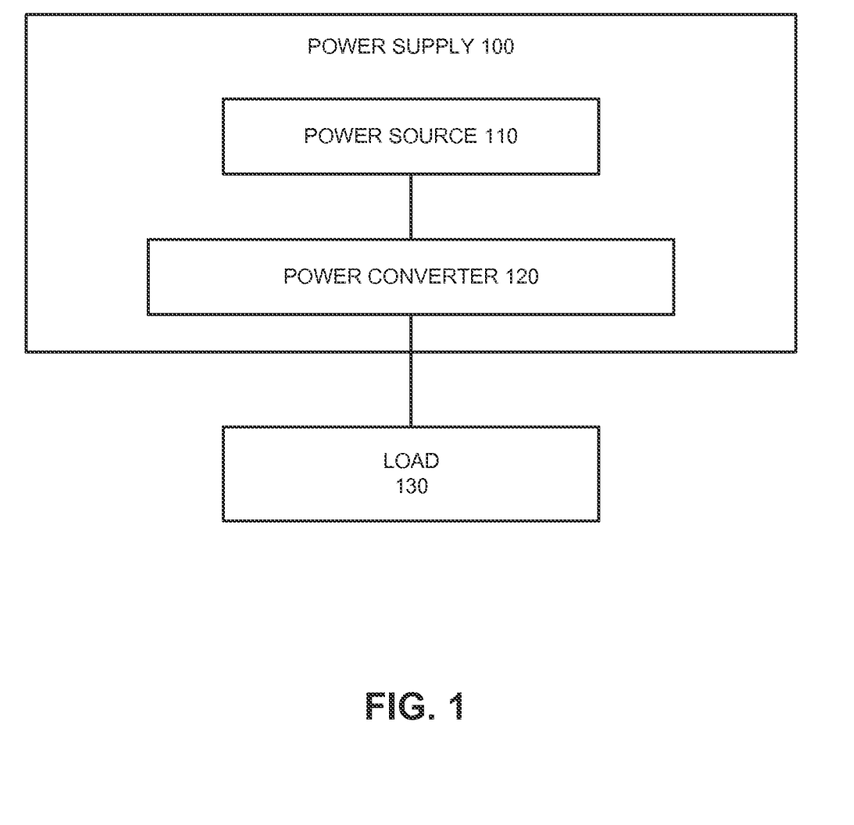
FIG. 1 shows a power supply for an electronic device in accordance with the disclosed embodiments.

The disclosed embodiments provide a power supply for an electronic device. As shown in FIG. 1, the power supply 100 includes a power source 110 and a power converter 120. Power converter 120 may obtain an input voltage from power source 110 and convert the input voltage into an output voltage that is used to drive a load 130. For example, power converter 120 may convert alternating current (AC) mains power into low-voltage direct current (DC) that is used to charge a battery and/or power components of a portable electronic device such as a mobile phone, laptop computer, portable media player, and/or tablet computer.

Furthermore, power supply 100 may be designed to accommodate size constraints associated with load 130. For example, the small form factor of a portable electronic device corresponding to load 130 may require the design of a similarly small power supply 100 for use with the portable electronic device. Moreover, gradual reductions in the size and/or weight of the portable electronic device over time may be accompanied by corresponding reductions in the size and/or weight of power supply 100 to further improve the portability of the portable electronic device.

Conversely, such size constraints may result in power losses that reduce the efficiency of power supply 100. In particular, power conversion in power supply 100 may involve a tradeoff between size and efficiency, in which larger electronic components (e.g., transformers, inductors, etc.) may generate a given output voltage at a lower switching frequency, and thus dissipate less power, than smaller electronic components. Because a small form factor for power supply 100 may require the use of small electronic components within power converter 120, power supply 100 may be associated with higher switching losses than a power supply with larger electronic components.

To mitigate switching losses in power supply 100, the switching frequency of power converter 120 may be varied in response to changes in load (e.g., from the portable electronic device) and/or input voltage (e.g., from power source 110). For example, the charging of a battery in the portable electronic device and/or the powering on or off of a component (e.g., processor, touchscreen, speakers, etc.) in the portable electronic device may cause the switching frequency of power converter 120 to sweep across a range of frequencies, such as frequencies ranging between 100 KHz and 400 KHz.

In turn, efficient operation of power supply 100 may require accurate sensing of the input voltage to power converter 120. For example, power converter 120 may comprise a switched-mode power supply (SMPS) that includes a flyback converter with a transformer, an auxiliary winding, and a primary switch. During operation of the flyback converter, the input voltage of the flyback converter may be sensed by measuring the voltage of an auxiliary winding in the flyback converter during the on-time of a primary switch in the flyback converter. For example, the input voltage may be sensed through the voltage on the auxiliary winding during the on-time of the primary switch because the voltage on the auxiliary winding is proportional to the input voltage. The sensed input voltage may then be used to control the switching frequency, duty cycle, and/or other operating parameters of the power converter. Likewise, the output voltage of the flyback converter may be sensed by measuring the voltage of a secondary winding in the flyback converter during the on-time of a primary switch in the flyback converter. The sensed output voltage may then be used to control the switching frequency, duty cycle, and/or other operating parameters of the power converter.

However, the voltage on the auxiliary winding may initially experience distortion, e.g., ringing, after the primary switch is toggled from an off-state to an on-state. After the voltage has settled, the measurement of the voltage may be made over a subsequent time period. As a result, accurate measurement of the voltage on the auxiliary winding may require that the primary switch in the flyback converter has a minimum on-time that includes both the time for the voltage to settle and the time required to perform the measurement.

In one or more embodiments, power supply 100 includes functionality to perform accurate sensing of the input voltage through measurements of voltage on one or more reference windings. As described in further detail below with respect to FIG. 2A, a measurement circuit in power supply 100 may sense the input voltage to the flyback converter (e.g., from power source 110) by measuring the voltage on the one or more auxiliary windings during the on-time of the primary switch. As is described in further detail below with respect to FIG. 2B, a measurement circuit in power supply 100 may also sense the output voltage of the flyback converter by measuring the voltage on the secondary winding during the on-time of the primary switch. A control circuit in power supply 100 may then use the input voltage to vary the switching frequency and/or other operating characteristics of power converter 120. The control circuit may also ensure that the on-time of the primary switch periodically exceeds an on-time threshold required for accurate sensing of the input voltage through measurements of voltage on the one or more reference windings. As a result, the control circuit may reduce errors associated with power converter 120 operation that result from inaccurate sensing of input voltages to power converter 120.

Figure 2A:
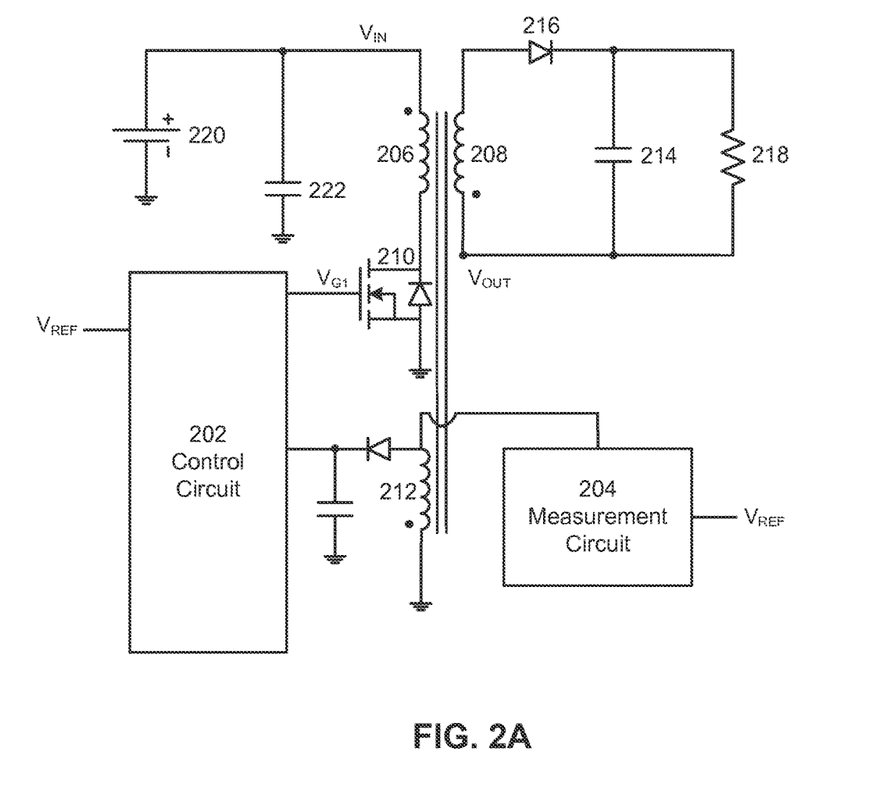
FIG. 2A shows an exemplary system for operating a flyback converter in accordance with the disclosed embodiments.

FIG. 2A shows a system for operating a power converter, in particular, a flyback converter, in accordance with an embodiment. As shown in FIG. 2A, a primary input voltage (e.g., "$V_{IN}$") is supplied from a power source 220 and/or a bulk capacitor 222 coupled to power source 220. For example, the input voltage may be obtained as AC mains power from a power outlet and/or a voltage from bulk capacitor 222, which is charged using the AC mains power. The input voltage may be converted into an output voltage (e.g., "$V_{OUT}$") by the flyback converter, which contains a primary winding 206, a secondary winding 208, an auxiliary winding 212, a primary switch 210, and a diode 216. Primary winding 206 and secondary winding 208 may form a transformer, and primary switch 210 may be a metal-oxide-semiconductor field-effect transistor (MOSFET) and/or other switching mechanism, e.g., a bipolar junction transistor (BJT), a junction gate field-effect transistor (JFET), an insulated gate field-effect transistor (IGFET), or an insulated-gate bipolar transistor (IGBT).

During operation of the flyback converter, a control circuit 202 may energize the primary winding of the transformer of the flyback converter by closing switch 210. For example, in instances where primary switch 210 is a MOSFET, control circuit 202 may toggle the MOSFET from an off-state to an on-state to couple primary winding 206 to power source 220. The varying current in primary winding 206 may create a varying magnetic flux in the transformer, resulting in a varying voltage in secondary winding 208. Because the voltage induced in secondary winding 208 is negative, diode 216 is reverse-biased, which prevents current flow during the induced negative voltage and effectively decouples secondary winding 208 from a resistive load 218 (e.g., a system load powered by the flyback converter) connected to the flyback converter. Alternatively, a switch (e.g., a secondary switch) may be substituted for diode 216 and operated in a complementary fashion from primary switch 210 to decouple secondary winding 208 from load 218.

Control circuit 202 may then transfer the energy stored in the primary winding 206 of the flyback converter to the secondary winding 208 by opening switch 210. For example, control circuit 202 may toggle the MOSFET providing switch 210 from the on-state to the off-state to de-energize the primary winding 206 of the flyback converter. During the de-energizing of the primary winding 206 of the flyback converter, the voltage in secondary winding 208 may be positive, which forward-biases diode 216 and allows current to flow from secondary winding 208. Some of the current may then be collected by a capacitor 214, which supplies the current to load 218 and acts as a low-pass filter by reducing voltage ripple caused by fluctuating current through secondary winding 208.

To repeatedly energize and de-energize the primary winding 206 of transformer, control circuit 202 may generate a gate signal (e.g., "$V_{G1}$") that continuously opens and closes primary switch 210 (e.g., by toggling a MOSFET providing primary switch 210 between an on-state and an off-state). Control circuit 202 may further adjust the frequency and/or duty cycle of the gate signal to control the voltage and/or current supplied to load 218. For example, control circuit 202 may use a pulse-width modulation (PWM) technique to generate a gate signal that produces a given output voltage and/or current based at least partially on a reference voltage (e.g., "$V_{REF}$") that represents a current and/or voltage measured from the flyback converter by a measurement circuit 204.

In particular, measurement circuit 204 may measure the voltage on auxiliary winding 212 (and/or one or more additional auxiliary windings, not shown), which may be proportional to the input voltage of the flyback converter when primary switch 210 is closed (e.g., when a MOSFET providing primary switch 210 is in an on-state) and the output voltage of the flyback converter when primary switch 210 is open (e.g., when a MOSFET providing primary switch 210 is in an off-state). Measurement circuit 204 may thus measure the voltage on auxiliary winding during the on-state of switch 210 to sense the input voltage and generate the reference voltage from the measured voltage to enable operation of the flyback converter based on the input voltage.

Those skilled in the art will appreciate that a minimum on-time of switch 210 may be required to obtain a measurement of the voltage on auxiliary winding 212 that accurately reflects the input voltage. For example, parasitic inductances and capacitances in the flyback converter may cause the voltage on auxiliary winding 212 to experience a period of distortion, e.g., "ringing," after switch 210 is toggled from an off-state to an on-state. After the distortion settles, measurement circuit 204 may require an additional period to acquire the measurement of voltage on auxiliary winding 212. Consequently, accurate sensing of the input voltage through a measurement of voltage on auxiliary winding 212 may require an on-time of switch 210 that is at least as long as the sum of the period required for the voltage to settle and the period required to make the measurement. On the other hand, such a minimum on-time may not occur and/or may occur sparingly during flyback operation with higher input voltages and/or under light-load conditions, thus interfering with accurate measurement of the input voltage and potentially resulting in errors in subsequent operation of the flyback converter.

In one or more embodiments, the system of FIG. 2A includes functionality to facilitate operation of the flyback converter by ensuring that switch 210 periodically has a pre-determined minimum on-time. Such a minimum on-time may be a period that is long enough to obtain a measurement of the voltage on auxiliary winding 212 that is representative of the input voltage. In particular, control circuit 202 and/or another component of the system may track the on-time of switch 210 during operation of the flyback converter. If the on-time does not exceed an on-time threshold (e.g., the predetermined minimum on-time) over a pre-specified time interval and/or number of switching cycles, the component may set the on-time to the on-time threshold to facilitate accurate sensing of the input voltage through the measured voltage on auxiliary winding 212.

For example, control circuit 202 may continuously sense the on-time of switch 210 to detect when the on-time falls below the on-time threshold. Once the on-time falls below the on-time threshold, control circuit 202 may start a counter that tracks the duration of below-threshold on-times in switch 210. Control circuit 202 may also compare the counter to a pre-specified period, which may be a time interval (e.g., one millisecond) and/or a number of switching cycles (e.g., 10) for toggling a MOSFET providing switch 210 between the on-state and off-state. If the counter exceeds the pre-specified period, control circuit 202 may extend the on-time to be longer than the on-time threshold so that measurement circuit 204 may obtain an accurate representation of the input voltage from a measurement of the voltage on auxiliary winding 212. To extend the on-time, control circuit 202 may modify the gate drive pulse used to toggle switch 210. Alternatively, control circuit 202 and/or another component of the system may indirectly extend the on-time by increasing the current limit threshold of a current sense comparator in a current mode controller. If the on-time exceeds the threshold during the pre-specified period (e.g., during normal operation of the flyback converter and/or manual extension of the on-time by control circuit 202), control circuit 202 may reset the counter. Extending the on-time of switch 210 to facilitate accurate measurement of the input voltage through the voltage on auxiliary winding 212 is described in further detail below with respect to FIGS. 3A-3B.

Those skilled in the art will appreciate that capacitor 222 may be peak-charged at light loads, which in turn may cause the input voltage to remain relatively constant. As a result, frequent sampling of the input voltage from capacitor 222 may be unnecessary. Instead, control circuit 202 may temporarily disable measurement of the input voltage through the voltage on auxiliary winding 212 if the input voltage exceeds a voltage threshold for more than a pre-specified number of consecutive measurements and/or time, as described in further detail below with respect to FIG. 5.

Those skilled in the art will also appreciate that auxiliary winding 212 could also be implemented in a given SMPS as one or more auxiliary windings and still provide the measurement functionality outlined above with respect to the use of single auxiliary winding 212 when primary switch 210 is closed.

Figure 2B:
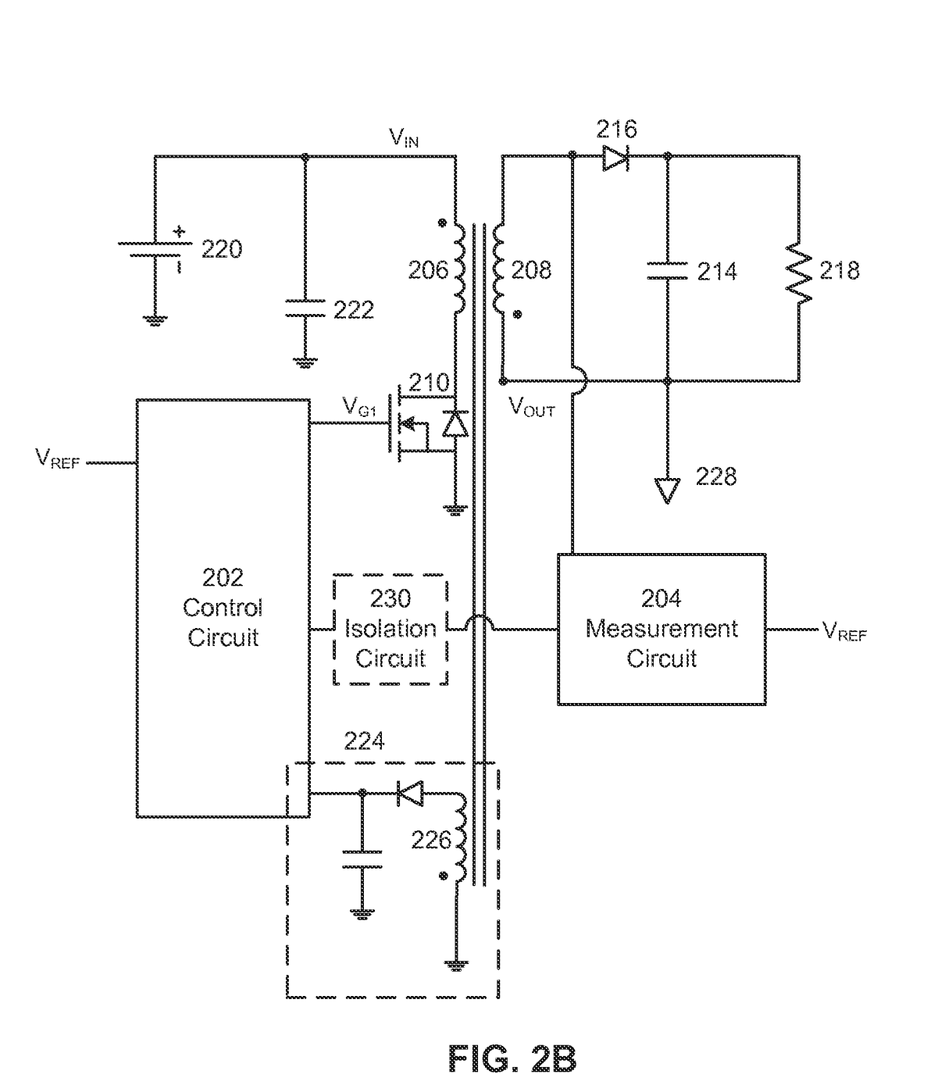
FIG. 2B shows another exemplary system for operating a flyback converter in accordance with the disclosed embodiments.

FIG. 2B shows a system for operating a power converter in accordance with another embodiment, in particular, a flyback converter wherein a secondary winding is used as the reference winding for voltage measurements. As was discussed above in reference to FIG. 2A, a primary input voltage (e.g., "$V_{IN}$") is supplied from a power source 220 and/or a bulk capacitor 222 coupled to power source 220. The input voltage may be converted into an output voltage (e.g., "$V_{OUT}$") by the flyback converter, which contains a primary winding 206, a secondary winding 208, an optional integrated circuit (IC) biasing circuit 224, an optional isolation circuit (e.g., an optocoupler) 230, a primary switch 210, and a diode 216. As with FIG. 2A, the primary winding 206 and secondary winding 208 of FIG. 2B may form a transformer, and primary switch 210 may be a switching mechanism for controlling the energizing and de-energizing of primary winding 206.

Contrasted with FIG. 2A, wherein the voltage was measured using an auxiliary winding 212 that reflects to the primary winding 206 as the reference winding, the voltage measurement in the flyback converter of FIG. 2B may instead be taken across the secondary winding 208, e.g., by measurement circuit 204. As with the flyback converter of FIG. 2A, in instances where primary switch 210 is a MOSFET, control circuit 202 may toggle the MOSFET from an off-state to an on-state to couple and decouple primary winding 206 to power source 220. The varying current in primary winding 206 may create a varying magnetic flux in the transformer, resulting in a varying voltage in secondary winding 208. Because the voltage induced in secondary winding 208 is negative, diode 216 is reverse-biased, which prevents current flow during the induced negative voltage and effectively decouples secondary winding 208 from the resistive load 218 connected to the flyback converter.

Unlike FIG. 2A, wherein the measurement circuit 204 is used to measure the voltage on auxiliary winding 212, the flyback converter of FIG. 2B may use measurement circuit 204 to sense the output voltage using secondary winding 208 as the reference winding during the off-state of switch 210. The turns-ratio between the primary and secondary windings may be used to determine the correct voltage conversion from the secondary winding to the primary winding. The converted measurement information may then be conveyed back to control circuit 202 via an optional isolation circuit 230 (such as an optocoupler), e.g., in cases where an isolated power converter is used (such as the illustrated flyback converter of FIG. 2B). Optional integrated circuit (IC) biasing circuit 224 comprising auxiliary winding 226 may also be used to provide a bias supply to the primary controller of the system. It should also be noted that ground reference 228 is shown using a triangle to illustrate that the output in FIG. 2B is isolated from the input (i.e., by the transformer), but ground reference 228 could also be a non-isolated ground reference, e.g., in instances where a non-isolated power converter is used.

Once the output voltage is sensed using secondary winding 208 as the reference winding, the system may proceed as described above in reference to FIG. 2A by ensuring that switch 210 periodically has a pre-determined minimum on-time that is long enough to obtain a measurement of the voltage on secondary winding 208 that is representative of the output voltage. In particular, control circuit 202 and/or another component of the system may track the on-time of switch 210 during operation of the flyback converter. If the on-time does not exceed an on-time threshold (e.g., the predetermined minimum on-time) over a pre-specified time interval and/or number of switching cycles, the component may set the on-time to the on-time threshold to facilitate accurate sensing of the output voltage through the measured voltage on secondary winding 208.

Figure 3A:
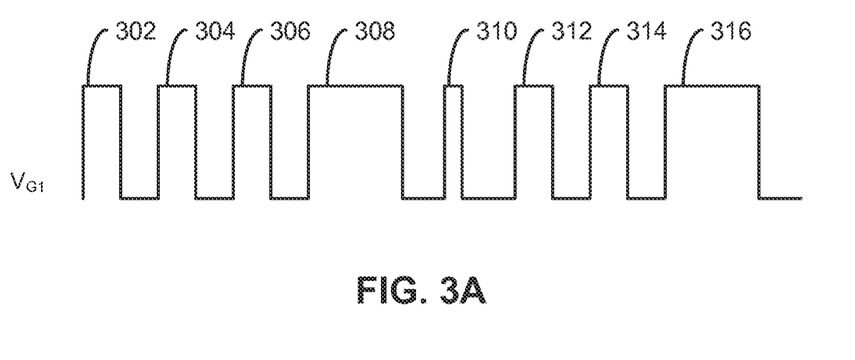
FIG. 3A shows an exemplary gate voltage associated with a primary switch of a flyback converter in accordance with the disclosed embodiments.

FIG. 3A shows an exemplary gate voltage associated with a primary switch (e.g., switch 210 of FIG. 2A) of a flyback converter in accordance with the disclosed embodiments. The gate voltage may represent a gate signal (e.g., "$V_{G1}$") for toggling the switch between an off-state and an on-state. As shown in FIG. 3A, the gate voltage may include a series of pulses 302-316 for placing the primary switch in an on-state. For example, the primary switch may be placed in the on-state by a high state of the gate voltage during each pulse. While the primary switch is in the on-state (e.g., during the on-time of the primary switch), the primary winding of the flyback converter may be coupled to a power source, and primary current in the primary winding may ramp up, resulting in a varying voltage in the secondary winding of the flyback converter.

The gate voltage may be placed in a low state between pulses 302-316 to toggle the primary switch to an off-state from the on-state. While the primary switch is in the off-state, primary current may cease to flow in the primary winding, while secondary current may discharge from the secondary winding to a load.

As mentioned above, accurate measurement of the input voltage to the flyback converter through a reference winding, such as an auxiliary winding of the flyback converter, may require a minimum on-time of the primary switch. To facilitate accurate sensing of the input voltage from the auxiliary winding, the on-time of the primary switch may be extended if the on-time does not exceed an on-time threshold representing the minimum on-time within a pre-specified period.

For example, light-load conditions may cause short pulses 302-306 to stop before the voltage on the auxiliary winding settles, which may limit the ability to accurately sense the input voltage from the auxiliary winding. In addition, pulses 302-306 may occur over a pre-specified period (e.g., number of milliseconds, switching cycles) representing an interval over which sensing of the input voltage is not required. A subsequent pulse 308 may be artificially extended to a pre-determined on-time, which may be longer than the on-time required to regulate the output of the flyback converter, to allow for a measurement of the voltage on the auxiliary winding that accurately represents the input voltage.

On the other hand, the extended on-time of pulse 308 may cause the flyback converter to output more power than is required by the load. In turn, one or more subsequent pulses (e.g., pulse 310) may be shorter than pulses 302-306 to allow the load to consume the additional power produced by pulse 308. Pulses 312-314 may then be generated during subsequent, normal operation of the flyback converter, until another pulse (e.g., pulse 316) is generated to provide for another measurement of the input voltage from the auxiliary winding. Consequently, the longer pulses 308 and 316 may allow for accurate sensing of the input voltage during conditions that may otherwise preclude voltage measurements from the auxiliary winding that are representative of the input voltage. Moreover, pulse 310 and/or the pre-specified periods before pulses 308 and 316 may allow the output voltage of the flyback converter to be regulated after excess power is outputted by the artificially extended pulses 308 and 316.

Figure 3B:
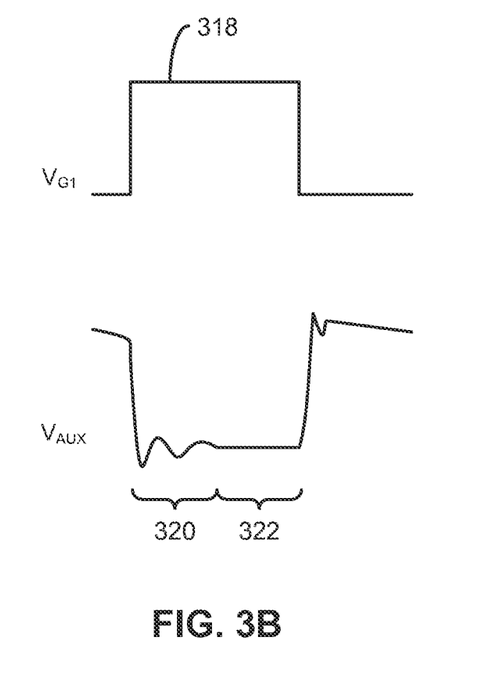
FIG. 3B shows an exemplary set of voltages in accordance with the disclosed embodiments.

FIG. 3B shows an exemplary set of voltages in accordance with the disclosed embodiments. More specifically, FIG. 3B shows the gate voltage (e.g., "$V_{G1}$") of a primary switch (e.g., switch 210 of FIG. 2A) in a flyback converter, as well as a voltage (e.g., "$V_{AUX}$") of an auxiliary winding (e.g., auxiliary winding 212 of FIG. 2A) in the flyback converter. During an on-state 318 of the primary switch, as represented by a high state in the gate voltage, the voltage on the auxiliary winding may initially experience a period 320 of distortion, e.g., ringing. After period 320 has passed, the voltage on the auxiliary winding may settle to a value that is representative of the input voltage of the flyback converter for another period 322 encompassing the remainder of an on-time corresponding to on-state 318.

During period 322, the input voltage may be accurately sensed from a measurement of the voltage on the reference winding. As a result, the on-time associated with on-state 318 may be set to at least the sum of period 320 and the time required to measure the voltage on the reference winding. Once the primary switch is toggled from on-state 318 to an off-state, the voltage on the reference winding may increase to reflect the output voltage of the flyback converter.

Figure 4:
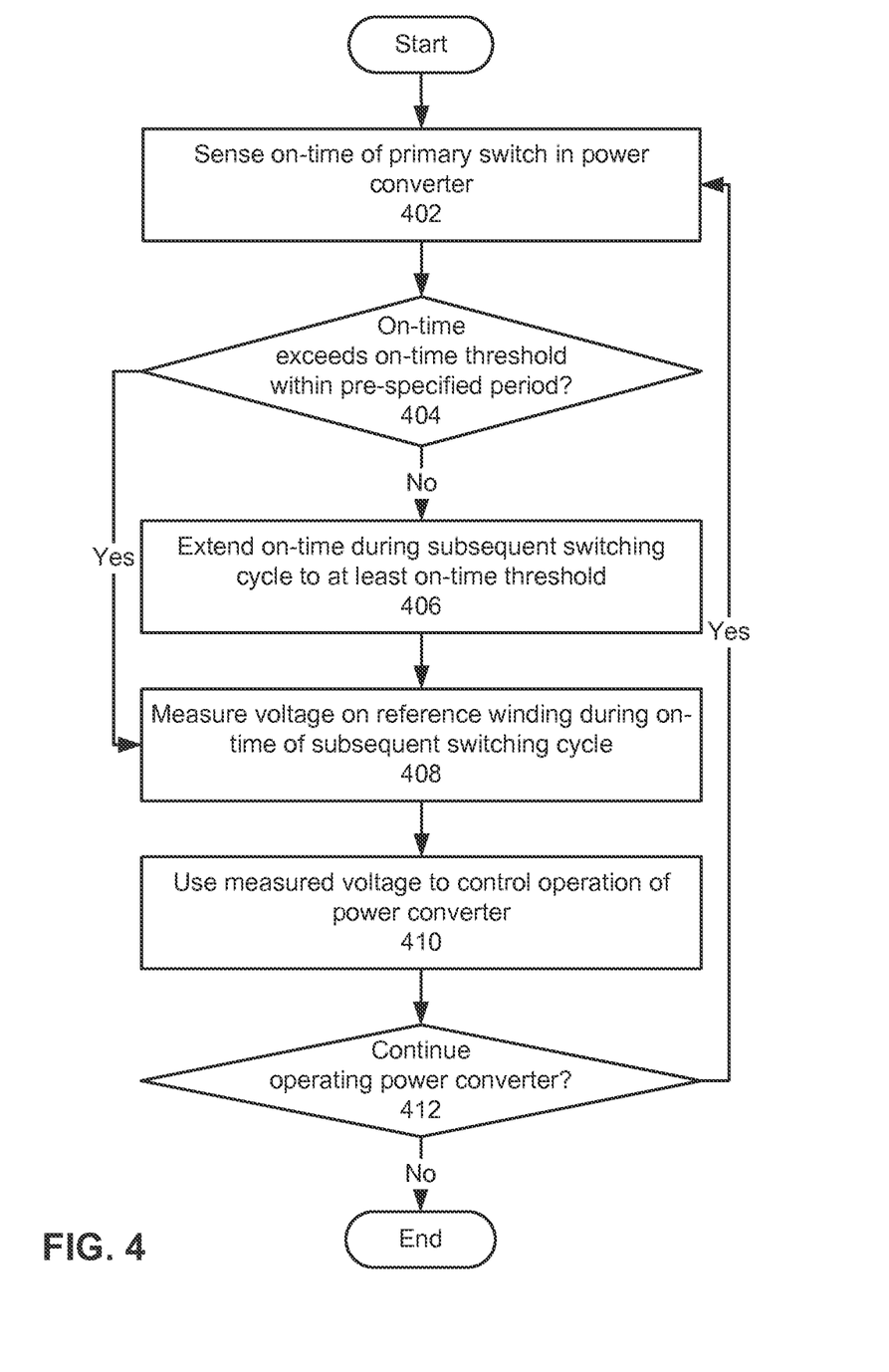
FIG. 4 shows a flowchart illustrating the process of facilitating the operation of a flyback converter in accordance with the disclosed embodiments.

FIG. 4 shows a flowchart illustrating the process of facilitating the operation of a flyback converter in accordance with the disclosed embodiments. In one or more embodiments, one or more of the steps may be omitted, repeated, and/or performed in a different order. Accordingly, the specific arrangement of steps shown in FIG. 4 should not be construed as limiting the scope of the embodiments.

Initially, the on-time of a primary switch in a power converter, e.g., a flyback converter, is sensed (operation 402) to determine if the on-time exceeds an on-time threshold within a pre-specified period (operation 404). The pre-specified period may span one or more switching cycles of the primary switch. The on-time threshold may represent a predetermined minimum time required to accurately sense the input voltage of the power converter from a measurement of a voltage on a reference winding in the power converter, e.g., an auxiliary winding that reflects to the primary winding of a transformer in the power converter. For example, the on-time threshold may encompass a first period associated with settling of the voltage on the reference winding after the primary switch toggles from an off-state to an on-state, as well as a second period associated with obtaining the measurement of the voltage on the reference winding.

If the on-time does not exceed the on-time threshold within the pre-specified period, the on-time is extended during a subsequent switching cycle to at least the on-time threshold (operation 406). For example, the on-time of the primary switch may be tracked, and a counter may be incremented while the on-time does not exceed the on-time threshold. Once the on-time is detected to exceed the on-time threshold, the counter may be reset. If the counter reaches the end of the pre-specified period (e.g., time interval, number of switching cycles, etc.) without being reset, the primary switch may be held in an on-state of the next switching cycle for long enough to accurately sense the input voltage from the reference winding. If the on-time exceeds the on-time threshold within the pre-specified period, the on-time is not extended, and tracking of the pre-specified period (e.g., with the counter) is reset.

The voltage on the reference winding is also measured (operation 408) during the on-time of the subsequent switching cycle, and the measured voltage is used to control the operation of the power converter (operation 410). For example, the voltage on the reference winding may be continuously and/or periodically measured during the on-time of the primary switch, and the measured voltage may be used to control the switching frequency, duty cycle, and/or other operating parameters of the power converter whenever the on-time of the primary switch reaches or exceeds the on-time threshold.

Operation of the power converter may continue (operation 412) during use of the power converter. For example, the power converter may be operated while the power converter is used to supply power to components of a portable electronic device. If operation of the power converter is to continue, the on-time of the primary switch in the power converter is periodically and/or continuously sensed (operation 402) to ensure that the on-time reaches or exceeds the on-time threshold at least once per pre-specified period (operations 404-406). The voltage on the reference winding is also measured and used to control the operation of the power converter (operations 408-410). Power converter operation based on accurate measurements of input voltage from the reference winding may thus continue until the power converter is no longer used to drive the load.

Figure 5:
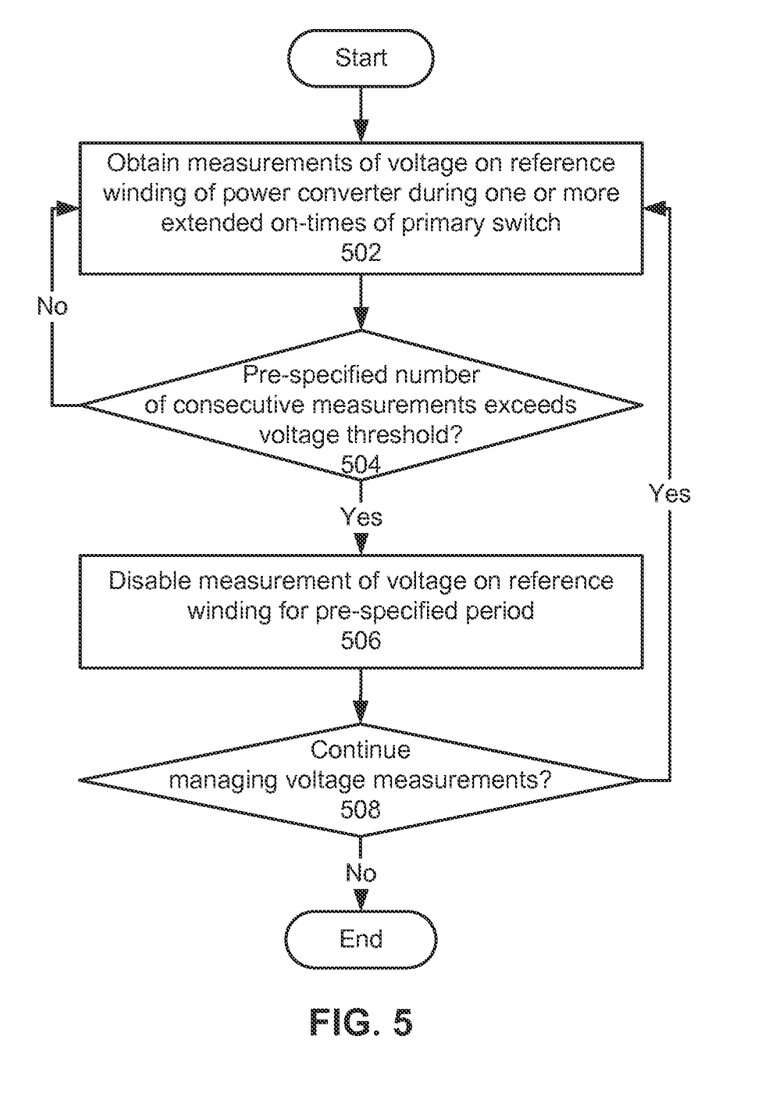
FIG. 5 shows a flowchart illustrating the process of performing measurements of input voltage in a flyback converter in accordance with the disclosed embodiments.

FIG. 5 shows a flowchart illustrating the process of performing measurements of input voltage in a power converter, e.g., a flyback converter, in accordance with the disclosed embodiments. In one or more embodiments, one or more of the steps may be omitted, repeated, and/or performed in a different order. Accordingly, the specific arrangement of steps shown in FIG. 5 should not be construed as limiting the scope of the embodiments.

First, one or more measurements of the voltage on a reference winding of the power converter, e.g., an auxiliary winding that reflects to the primary winding of a flyback converter, are obtained during one or more extended on-times of a primary switch in the power converter (operation 502). For example, each measurement may be made during an on-time of the primary switch that is artificially extended to be longer than the sum of the time for the voltage to settle and the time to make the measurement. As a result, the measurements may accurately reflect the input voltage of the power converter.

A pre-specified number of consecutive measurements may exceed a voltage threshold (operation 504). For example, the measurements of the voltage on the reference winding may exceed the voltage threshold four consecutive times, indicating peak charging of a bulk capacitor in the power converter. On the other hand, the measurements may fail to meet the pre-specified number if one or more of four consecutive measurements fall below the voltage threshold.

If the measurements do not exceed the voltage threshold the pre-specified number of times, measurements of the voltage on the reference winding may continue to be obtained (operation 502) until a pre-specified number of consecutive measurements exceeds the voltage threshold. Once the pre-specified number of consecutive measurements exceeds the voltage threshold, measurement of the voltage on the reference winding during the extended on-time is disabled for a pre-specified period (operation 506). For example, artificial extension of the on-time past the time required to regulate the output of the power converter may be disabled for a pre-specified time interval (e.g., 14 ms) and/or number of switching cycles after a certain number of consecutive measurements of voltage on the reference winding indicate that the bulk capacitor of the power converter is peak-charged.

Management of voltage measurements from the reference winding may continue (operation 508) during sensing of the input voltage through the voltage measurements. If management of the voltage measurements is to continue, the measurements may be tracked to determine if a pre-specified consecutive number of the measurements exceeds the voltage threshold (operations 502-504). If the pre-specified consecutive number of measurements does not meet the voltage threshold, the measurements may continue to be obtained and tracked (operation 502). If the pre-specified consecutive number of measurements meets the voltage threshold, measurement of the voltage on the reference winding during the extended on-time is disabled for a pre-specified period (operation 506). Such management of voltage measurements from the reference winding may continue until the voltage measurements are no longer used to sense the input voltage and/or the voltage measurements are to be made continuously during operation of the power converter.

Figure 6:
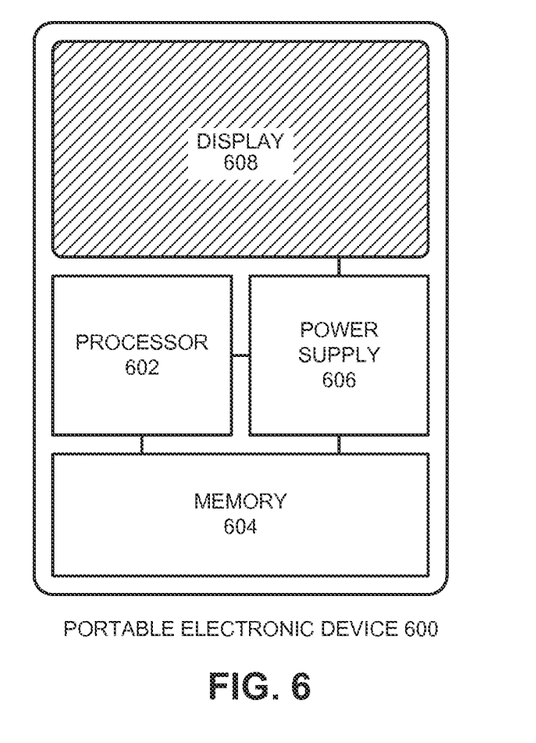
FIG. 6 shows a portable electronic device in accordance with the disclosed embodiments.

The above-described power supply can generally be used in any type of electronic device. For example, FIG. 6 illustrates a portable electronic device 600 which includes a processor 602, a memory 604 and a display 608, which are all powered by a power supply 606. Portable electronic device 600 may correspond to a laptop computer, tablet computer, mobile phone, PDA, portable media player, digital camera, and/or other type of battery-powered electronic device with a touchscreen, touchpad, and/or other touch-sensitive input device. Power supply 606 may include a power converter, e.g., a flyback converter that contains a transformer, an auxiliary winding, and a primary switch. Power supply 606 may also include a measurement circuit that makes a measurement of the voltage on the auxiliary winding during an on-time of the primary switch. Finally, power supply 606 may include a control circuit that continuously senses the on-time of the primary switch. Upon detecting that the on-time does not exceed an on-time threshold within a pre-specified period, the control circuit may extend the on-time to at least the on-time threshold to facilitate accurate sensing of the input voltage from the measurement of the voltage on the auxiliary winding.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for facilitating the operation of a switched-mode power converter, comprising:
    sensing an on-time of a primary switch in the power converter;
    upon detecting that the sensed on-time does not exceed an on-time threshold within a first pre-specified period that spans one or more switching cycles, extending an on-time during a subsequent switching cycle to at least meet the on-time threshold; and
    measuring a voltage on a reference winding of the power converter during the extended on-time of the subsequent switching cycle.

2. The method of claim 1, further comprising:
    using the measured voltage to control the operation of the power converter.

3. The method of claim 2, wherein controlling the operation of the power converter comprises at least one of:
    controlling a switching frequency of the power converter;
    controlling an on-time or off-time of the power converter;
    controlling a current level of the power converter; and
    controlling a duty cycle of the primary switch.

4. The method of claim 1, further comprising:
    obtaining one or more additional measurements of the voltage on the reference winding during one or more subsequent extended on-times of the primary switch;
    upon detecting that a number of consecutive measurements comprising the measured voltage and the one or more additional measurements exceeds the voltage threshold, disabling measurement of the voltage on the reference winding for a second pre-specified period.

5. The method of claim 1, wherein the on-time threshold is based on:
    a first period associated with settling of the voltage on the reference winding; and
    a second period associated with measuring the voltage on the reference winding.

6. The method of claim 1, wherein the reference winding comprises at least one of:
    an auxiliary winding that reflects to a primary winding of the power converter; and
    a secondary winding of the power converter.

7. The method of claim 1, further comprising measuring a second voltage on the reference winding during an off-time of the primary switch and using the measured second voltage to monitor or control operation of the power converter.

8. A system for operating a switched-mode power converter, comprising:
a control circuit configured to:
sense an on-time of a primary switch in the power converter; and
upon detecting that the sensed on-time does not exceed an on-time threshold within a first pre-specified period that spans one or more switching cycles, extend an on-time during a subsequent switching cycle to at least meet the on-time threshold; and
a measurement circuit configured to measure a voltage on a reference winding of the power converter during the extended on-time of the subsequent switching cycle.

9. The system of claim 8, wherein the control circuit is further configured to:
use the measured voltage to control the operation of the power converter.

10. The system of claim 9, wherein controlling the operation of the power converter comprises at least one of:
controlling a switching frequency of the power converter;
controlling an on-time or off-time of the power converter;
controlling a current level of the power converter; and
controlling a duty cycle of the primary switch.

11. The system of claim 8,
wherein the measurement circuit is further configured to obtain one or more additional measurements of the voltage on the reference winding during one or more subsequent extended on-times of the primary switch, and
wherein the control circuit is further configured to disable measurement of the voltage on the reference winding for a second pre-specified period upon detecting that a pre-specified number of consecutive measurements comprising the measured voltage and the one or more additional measurements exceeds the voltage threshold.

12. The system of claim 8, wherein the reference winding comprises at least one of:
an auxiliary winding that reflects to a primary winding of the power converter; and
a secondary winding of the power converter.

13. The system of claim 8, wherein the on-time threshold comprises:
a first period associated with settling of the voltage on the reference winding; and
a second period associated with measuring the voltage on the reference winding.

14. The system of claim 8, wherein the measurement circuit is further configured to measure a second voltage on the reference winding during an off-time of the primary switch, and the control circuit is further configured to use the measured second voltage to monitor or control operation of the power converter.

15. A switched-mode power supply, comprising:
a transformer;
an auxiliary winding;
a primary switch;
a control circuit configured to:
sense an on-time of the primary switch; and
upon detecting that the sensed on-time does not exceed an on-time threshold within a first pre-specified period that spans one or more switching cycles, extend an on-time during a subsequent switching cycle to at least meet the on-time threshold; and
a measurement circuit configured to measure a voltage on the auxiliary winding during the extended on-time of the subsequent switching cycle.

16. The switched-mode power supply of claim 15, wherein the control circuit is further configured to:
use the measured voltage to control the operation of the switched-mode power supply.

17. The switched-mode power supply of claim 16, wherein controlling the operation of the switched-mode power supply comprises at least one of:
controlling a switching frequency of the switched-mode power supply;
controlling an on-time or off-time of the switched-mode power supply;
controlling a current level of the switched-mode power supply; and
controlling a duty cycle of the primary switch.

18. The switched-mode power supply of claim 15,
wherein the measurement circuit is further configured to obtain one or more additional measurements of the voltage on the auxiliary winding during one or more subsequent extended on-times of the primary switch, and
wherein the control circuit is further configured to disable measurement of the voltage on the auxiliary winding for a second pre-specified period upon detecting that a pre-specified number of consecutive measurements comprising the measurement and the one or more additional measurements exceeds the voltage threshold.

19. The switched-mode power supply of claim 15, wherein the first pre-specified period is at least one of:
a time interval; and
a number of switching cycles of the primary switch.

20. The switched-mode power supply of claim 15, wherein the on-time threshold comprises:
a first period associated with settling of the voltage on the auxiliary winding; and
a second period associated with measuring the voltage on the auxiliary winding.

* * * * *